US012809275B2

(12) United States Patent
Beukman et al.

(10) Patent No.: US 12,809,275 B2
(45) Date of Patent: Nov. 24, 2026

(54) CONFIGURABLE PRINTED OPTICAL ROUTING FOR PARALLEL OPTICAL DETECTION

(71) Applicant: ASML Netherlands B.V., Veldhoven (NL)

(72) Inventors: Arjan Johannes Anton Beukman, Son en Breugel (NL); Filippo Alpeggiani, Waalre (NL); Simon Reinald Huisman, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 77 days.

(21) Appl. No.: 18/855,565

(22) PCT Filed: Mar. 28, 2023

(86) PCT No.: PCT/EP2023/057958
§ 371 (c)(1),
(2) Date: Oct. 9, 2024

(87) PCT Pub. No.: WO2023/198444
PCT Pub. Date: Oct. 19, 2023

(65) Prior Publication Data

US 2025/0341787 A1 Nov. 6, 2025

Related U.S. Application Data

(60) Provisional application No. 63/331,748, filed on Apr. 15, 2022.

(51) Int. Cl.
*G01B 11/27* (2006.01)
*G03F 7/00* (2006.01)

(52) U.S. Cl.
CPC ...... *G03F 7/706851* (2023.05); *G01B 11/272* (2013.01); *G03F 7/70625* (2013.01); *G03F 7/70633* (2013.01); *G03F 7/706849* (2023.05)

(58) Field of Classification Search
CPC ........... G03F 7/706851; G03F 7/70625; G03F 7/70633; G03F 7/706849; G03F 9/7069; G03F 9/7088; G01B 11/272
(Continued)

(56) References Cited

U.S. PATENT DOCUMENTS 5,488,230 A * 1/1996 Mizutani .............. G03F 9/7076
250/548
6,297,876 B1 10/2001 Bornebroek
(Continued)

FOREIGN PATENT DOCUMENTS

WO WO 2015/062854 A1 5/2015
WO WO 2021/259618 A1 12/2021

OTHER PUBLICATIONS

International Search Report and Written Opinion of the International Searching Authority directed to International Patent Application No. PCT/EP2023/057958, mailed Jul. 7, 2023; 16 pages.
(Continued)

*Primary Examiner* — Isiaka O Akanbi
(74) *Attorney, Agent, or Firm* — Pillsbury Winthrop Shaw Pittman, LLP

(57) ABSTRACT

Disclosed herein are embodiments that relate to a metrology apparatus and associated methods for imaging a plurality of targets (e.g., alignment marks) disposed on of a substrate (550, 650) in parallel using a fixed sensor (510, 530, 610) component that provides electrical, optical, and mechanical connections in combination with a swappable optical routing component (520, 620, 720). The swappable optical routing component (520, 620, 720) allows for target alignment marks to be placed in a field in any desirable configuration.

20 Claims, 10 Drawing Sheets

(58) Field of Classification Search
USPC .................................. 356/614–625, 399–401
See application file for complete search history.

(56) References Cited

U.S. PATENT DOCUMENTS

| | | | | |
|---|---|---|---|---|
| 6,961,116 | B2 | 11/2005 | Den Boef et al. | |
| 7,511,799 | B2 | 3/2009 | Tel et al. | |
| 8,706,442 | B2 | 4/2014 | Mos et al. | |
| 2004/0263860 | A1* | 12/2004 | Johnson ................ | G03F 9/7049 356/499 |
| 2004/0268286 | A1 | 12/2004 | New et al. | |
| 2009/0195768 | A1 | 8/2009 | Bijnen et al. | |
| 2011/0058151 | A1* | 3/2011 | Takenaka .............. | G03F 9/7088 355/53 |
| 2013/0313744 | A1* | 11/2013 | Maruyama ............ | B29C 59/026 425/150 |
| 2014/0146326 | A1* | 5/2014 | Himmel ............. | G01D 5/34784 356/616 |
| 2015/0013559 | A1* | 1/2015 | Hayashi ................ | G03F 7/0002 101/450.1 |
| 2015/0192515 | A1* | 7/2015 | Iwai ...................... | G03F 9/7088 355/53 |
| 2015/0377614 | A1* | 12/2015 | Sato ..................... | G01B 11/254 425/150 |
| 2017/0040196 | A1* | 2/2017 | Takakuwa ............. | G03F 7/0002 |
| 2017/0139132 | A1 | 5/2017 | Patel et al. | |
| 2020/0127438 | A1 | 4/2020 | Bovington et al. | |
| 2023/0213868 | A1* | 7/2023 | Swillam ................. | G02B 6/293 355/67 |
| 2023/0213871 | A1* | 7/2023 | Goorden ............. | G03F 7/70625 355/67 |

OTHER PUBLICATIONS

Niu et al., “Specular Spectroscopic Scatterometry in DUV Lithography,” Proc. SPIE, vol. 3677, Metrology, Inspection, and Process Control for Microlithography XIII, Jun. 14, 1999; 10 pages.

Raymond et al., “Multiparameter grating metrology using optical scatterometry,” Journal of Vacuum Science & Technology B: Microelectronics and Nanometer Structures Processing, Measurement, and Phenomena, vol. 15, No. 2, Mar. 1997; pp. 361-368.

“Configurable Printed Optical Routing for Parallel Optical Detection,” Research Disclosure No. 698020, May 3, 2022; 36 pages.

* cited by examiner

800

CONFIGURABLE PRINTED OPTICAL ROUTING FOR PARALLEL OPTICAL DETECTION

CROSS-REFERENCE TO RELATED APPLICATIONS

This application claims priority of U.S. application 63/331,748 which was filed on Apr. 15, 2022 and which is incorporated herein in its entirety by reference.

TECHNICAL FIELD

The present disclosure relates to a metrology apparatus and associated methods for using a fixed sensor with configurable optical routing to detect targets on a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps can require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus can use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters can include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

Past technology for alignment sensors measure a single alignment mark at a time. Measuring multiple marks in parallel is still being investigated. For example, parallel sensor concepts include a variety of challenges including how to geometrically arrange the sensors in a space to allow the highest number of parallel acquisitions.

SUMMARY

Accordingly, provided herein are various embodiments of a metrology system for imaging a plurality of target alignment marks of a substrate.

Some embodiments are directed to a detection module and a replaceable optical routing component that is optically coupled to the detection module. The replaceable optical routing component can comprise a plurality of optical routing elements. In some embodiments, the substrate is configured to be moved to a first position so as to be under the replaceable optical routing component such that a first end of each of the plurality of optical routing elements is configured to overlay one of the plurality of target alignment marks and a second end of each of the plurality of optical routing elements is optically coupled to the detection module. Additionally, the substrate can be further configured to be moved to a second position so as not to be positioned under the replaceable optical routing element.

In some embodiments, the replaceable optical routing component can include waveguides or optical couplers.

In some embodiments, the replaceable optical routing component can be configured to permit the plurality of optical routing elements to be disposed thereon in a plurality of different locations.

In some embodiments, the replaceable optical routing component can be configured to guide light to or from the plurality of optical routing elements.

In some embodiments, the plurality of target alignment marks can be imaged in parallel.

In some embodiments, the plurality of optical routing elements can be configured to detect light.

In some embodiments, the replaceable optical routing component can include active or passive integrated photonic elements.

Some embodiments are directed to a detection module and a replaceable optical routing component that is optically coupled to the detection module, and a plurality of optical routing elements. In some embodiments, the replaceable optical routing component is configured to be positioned to overlay a substrate such that each of the plurality of optical routing elements overlays one of the plurality of target alignment marks disposed on the substrate.

In some embodiments, the replaceable optical routing component can include waveguides or optical couplers.

In some embodiments, the replaceable optical routing component can be configured to permit the plurality of optical routing elements to be disposed thereon in a plurality of different locations.

In some embodiments, the replaceable optical routing component can be configured to guide light to or from the plurality of optical routing elements.

In some embodiments, the plurality of target alignment marks can be imaged in parallel.

In some embodiments, the plurality of optical routing elements can be configured to detect light.

In some embodiments, the replaceable optical routing component can include active or passive integrated photonic elements.

Some embodiments are directed to a replaceable optical routing component, comprising a plurality of optical routing elements and a plurality of sensors. In some embodiments, the replaceable optical routing component is configured to be moved to a first position so as to overlay the substrate such that a first end of each of the plurality of optical routing elements overlays one of the plurality of target alignment marks. In some embodiments, a second end of each of the plurality of optical routing elements is optically coupled to one of the plurality of sensors. In some embodiments, the replaceable optical routing component is further configured to be moved to a second position so as not to overlay the substrate.

In some embodiments, the replaceable optical routing component can include waveguides or optical couplers.

In some embodiments, the replaceable optical routing component can be configured to permit the plurality of optical routing elements to be disposed thereon in a plurality of different locations.

In some embodiments, the replaceable optical routing component can be configured to guide light to or from the plurality of optical routing elements.

In some embodiments, the plurality of target alignment marks can be imaged in parallel.

In some embodiments, the replaceable optical routing component can include active or passive integrated photonic elements.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
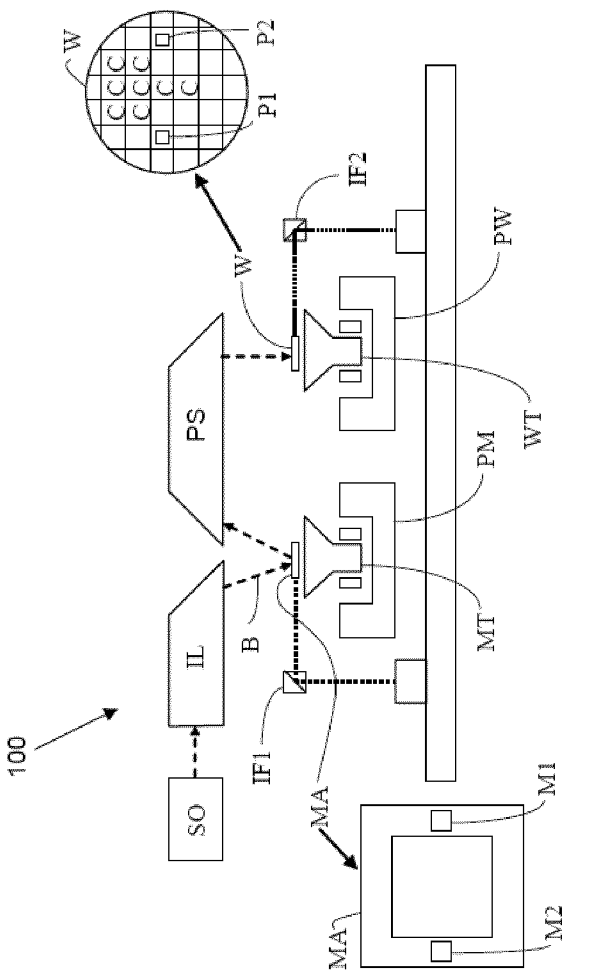
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example lithographic systems will now be described.

Figure 1B:
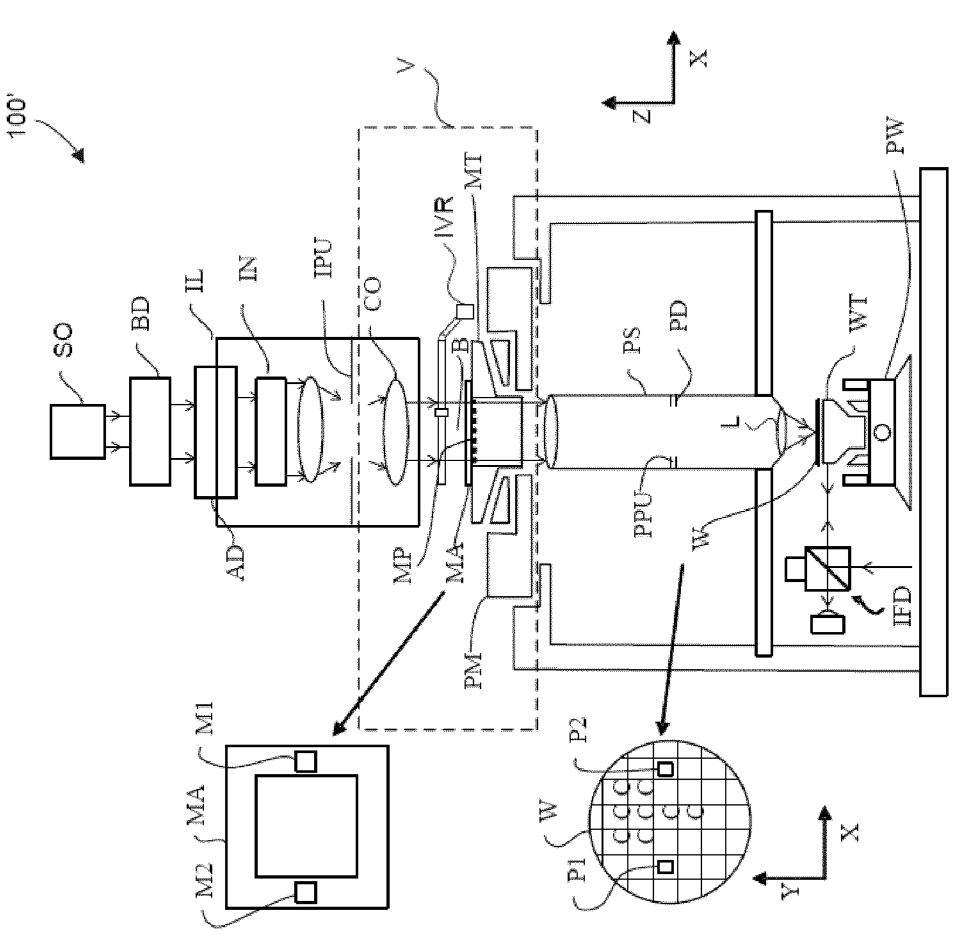
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The terms "inspection apparatus," "metrology system," or the like can be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PScan encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image of the mask pattern MP, where the image is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IFD (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
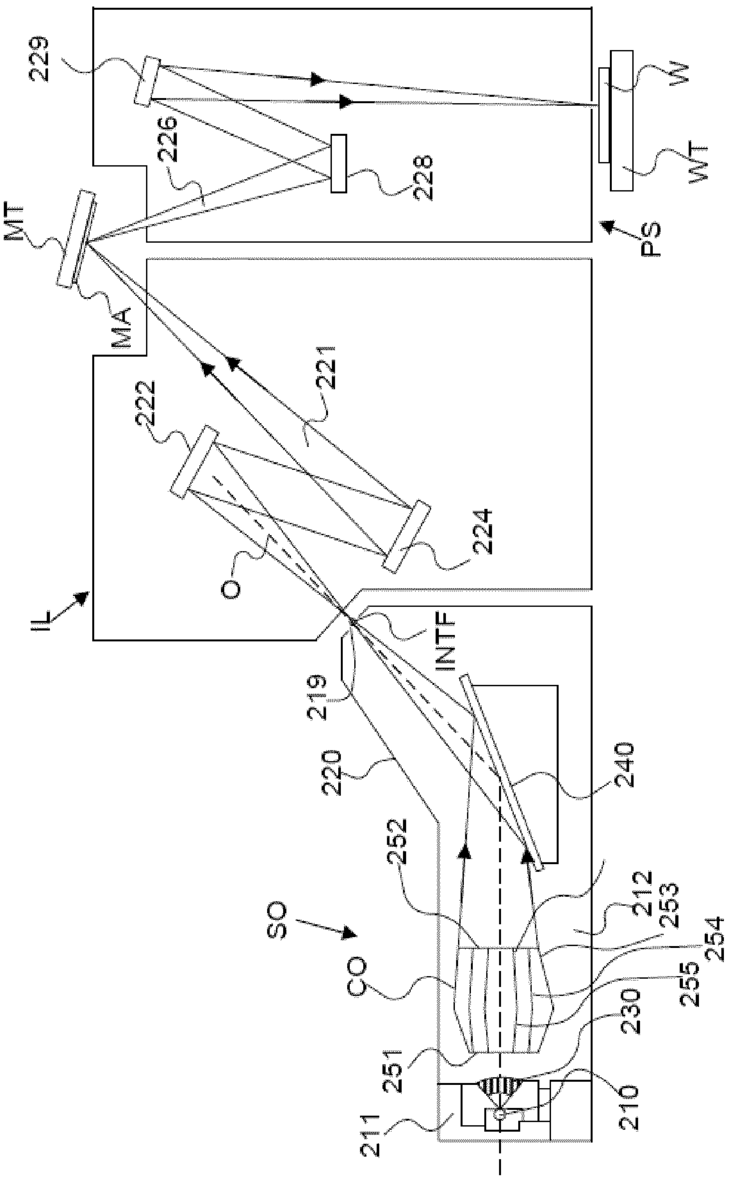
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point INTF. The virtual source point INTF is commonly referred to as the intermediate focus, and the source collector apparatus is arranged such that the intermediate focus INTF is located at or near an opening 219 in the enclosing structure 220. The virtual source point INTF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

An exemplary lithographic cell will now be described.

Figure 3:
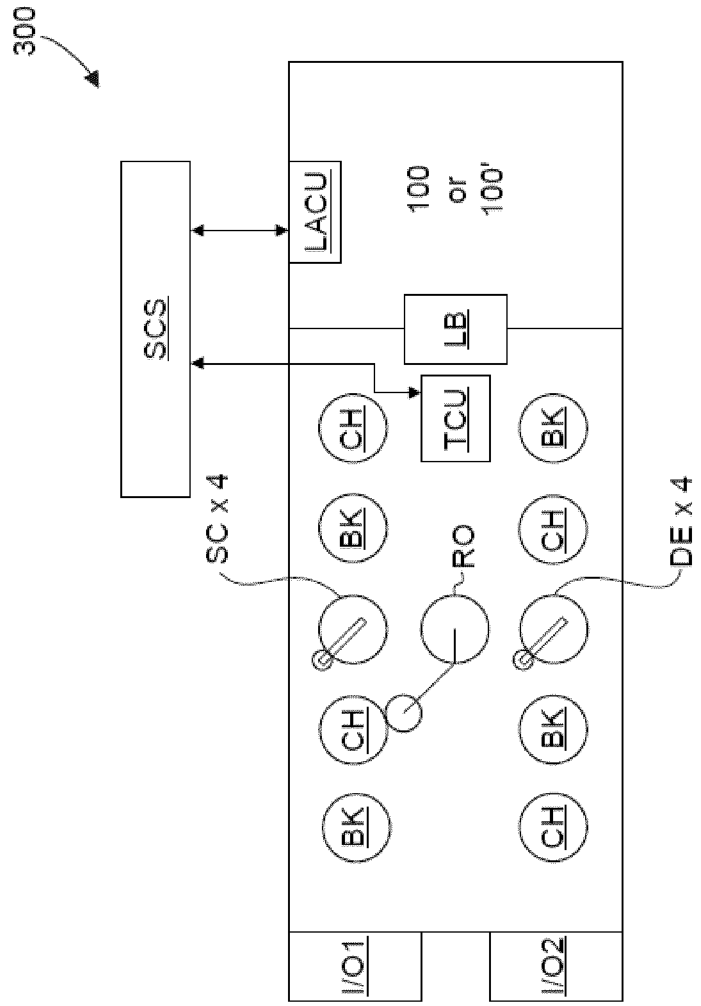
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' can form part of lithographic cell 300. Lithographic cell 300 can also include one or more apparatuses to perform pre- and post-exposure processes on a substrate. In some examples, these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

An exemplary inspection apparatus will now be described.

In order to control the lithographic process to place device features accurately on the substrate, alignment marks are generally provided on the substrate, and the lithographic apparatus includes one or more inspection apparatuses for accurate positioning of marks on a substrate. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al). Generally marks are measured separately to obtain X- and Y-positions. A combined X- and Y-measurement can be performed using the techniques described in U.S. Publication No. 2009/195768 A (Bijnen et al), however. The full contents of both of these disclosures are incorporated herein by reference.

Figure 4A:
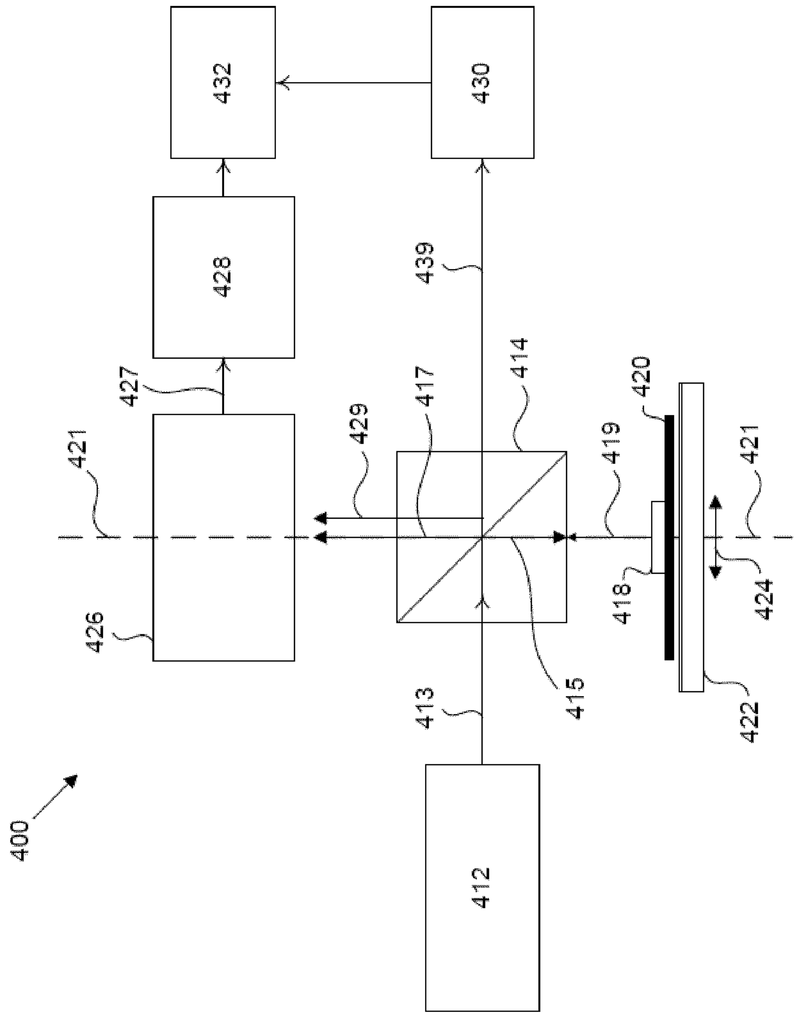
FIGS. 4A and 4B show schematics of lithographic apparatuses, according to some embodiments.

FIG. 4A shows a schematic of a cross-sectional view of an inspection apparatus 400 that can be implemented as a part of lithographic apparatus 100 or 100', according to some embodiments. In some embodiments, inspection apparatus 400 can be configured to align a substrate (e.g., substrate W) with respect to a patterning device (e.g., patterning device MA). Inspection apparatus 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, inspection apparatus 400 can include an illumination system 412, a beam splitter 414, an interferometer 426, a detector 428, a beam analyzer 430, and an overlay calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., inspection apparatus 400) compared to the current alignment apparatuses.

In some embodiments, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, beam splitter 414 can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and unrotated images interferometrically.

In some embodiments, detector 428 can be configured to receive the recombined image via interferometer signal 427 and detect interference as a result of the recombined image when alignment axis 421 of inspection apparatus 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can, for example, be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order Enhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of inspection apparatus 400 or any other reference element such that the center of symmetry of alignment mark or target 418 can be known with reference to inspection apparatus 400 or any other reference element. Beam analyzer 430 can be a point or an imaging polarimeter with some form of wavelength-band selectivity. In some embodiments, beam analyzer 430 can be directly integrated into inspection apparatus 400, or connected via fiber optics of several types: polarization preserving single mode, multimode, or imaging, according to other embodiments.

In some embodiments, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
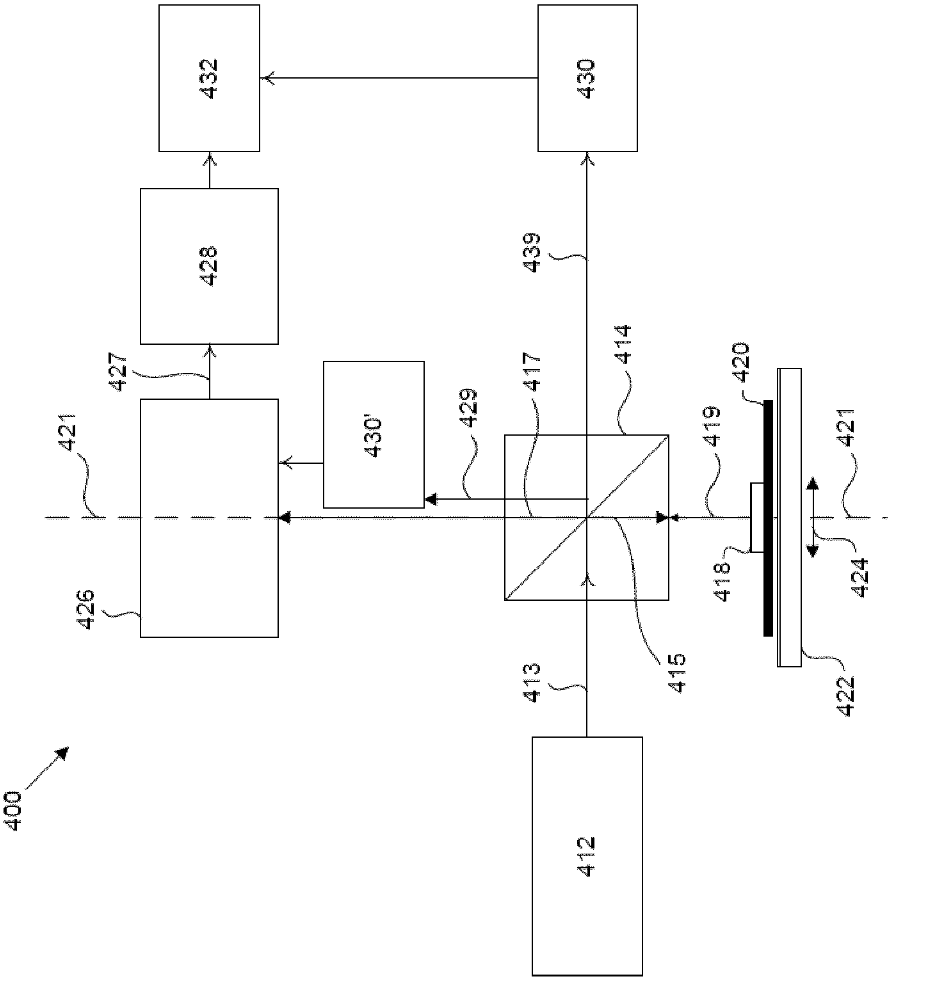

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of inspection apparatus 400, or any other reference element, such that the center of symmetry of alignment mark or target 418 can be known with reference to inspection apparatus 400, or any other reference element. Second beam analyzer 430' can be further configured to determine the overlay data between two patterns and a model of the product stack profile of substrate 420. Second beam analyzer 430' can also be configured to measure overlay, critical dimension, and focus of target 418 in a single measurement.

In some embodiments, second beam analyzer 430' can be directly integrated into inspection apparatus 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an overlay calculation processor. The information can comprise a model of the product stack profile constructed by beam analyzer 430. Alternatively, processor 432 can construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the inspection apparatus 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. The process may have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 can group marks into sets of similar overlay error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the overlay, for example, by feeding corrections into the inspection apparatus 400.

Exemplary embodiments of swappable elements will now be described. Alignment marks can vary in spacing due to various desired configurations and provided herein is a solution with a fixed sensor component and swappable routing components. The alignment marks can be read out in parallel.

It is desirable to align on more alignment marks to allow for higher density sampling of wafer deformations. More marks are possible on the wafer, but the alignment marks must be made smaller. Hence, it is desirable to have a high-end alignment sensor as opposed to multiple different types of sensors to match and maintain the different layouts of target alignment marks on the wafer. By having one sensor capable of multiple embodiments, the alignments marks are free to be placed on the field in any desirable configuration.

Provided herein is an alignment sensor split into two parts: a core sensor and a replaceable optical routing element. In some embodiment, the core apparatus, or support apparatus, remains unchanged for all types of apparatuses. The core apparatus provides electrical, optical, and mechanical connections, structural support, and a variety of other functionalities.

The replaceable routing element allows for matching the light routing between the core apparatus and a specific layout of alignment marks on the wafer that should be measured. The replaceable routing element can be a custom printed routing wafer, which contains optical routing. The optical routing may consist of integrated optics such as waveguides or couplers. The replaceable routing element is a part of the alignment sensor and is therefore, different than the wafer being measured. Different layouts may be required. The different replaceable routing elements can match a specific wafer.

The metrology system described herein is advantageous since there are no moveable part within the sensor. This allows for an easier mechanical apparatus, such as less cabling or a lack of heat sources. With replaceable routing elements, more configurations for imaging a plurality of target alignment marks of a substrate.

The following figures further describe the various embodiments of a metrology system for imaging a plurality of target alignment marks of a substrate.

Figure 5:
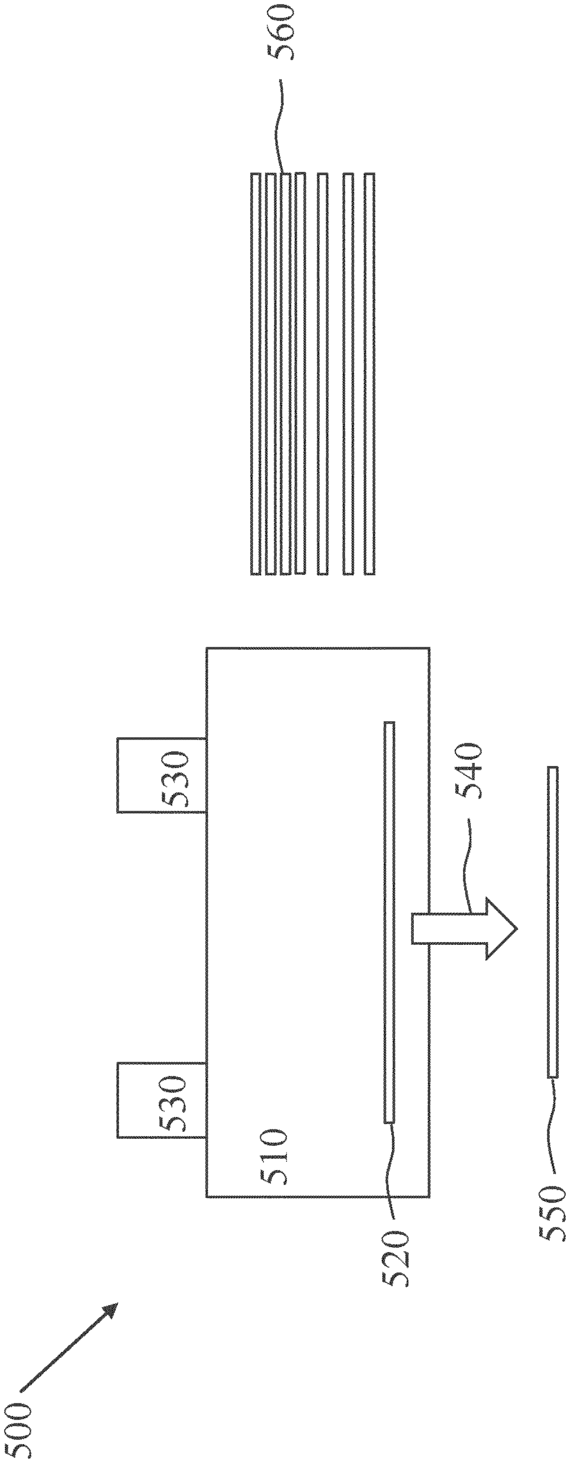
FIG. 5 shows a metrology system for imaging a plurality of target alignment marks of a substrate, according to an embodiment.

FIG. 5 shows a metrology system 500 for imaging a plurality of target alignment marks disposed on a substrate (e.g., wafer) 550 with a radiation beam 540, according to some embodiments. System 500 comprises a fixed alignment sensor head 510 and plural fixed, parallel sensor heads 530. Fixed alignment sensor head 510 is a part of the core apparatus presented earlier. Replaceable optical routing element 520 can be selected from a library 560 housing a plurality of replaceable routing elements 520. The plurality of replaceable optical routing elements 520 can have different or similar configurations. Further, the replaceable optical routing element 520 can be similar to a reticle or a wafer, but adapted for use as an alignment sensor. The wafer 550 is positioned underneath the fixed alignment sensor head 510. Fixed parallel sensor heads 530 are disposed on or within the fixed alignment sensor head 510.

The replaceable optical routing elements 520 can be a custom printed routing wafer that may contain optical routing integrated optics such as waveguides or couplers. The light can be optically routed throughout the sensors based on the different embodiments described below. Different layouts may require different replaceable optical routing elements 520, which can be easily swapped into and out of the fixed alignment sensor head 510 from the library 560. Alternatively or in combination, the replaceable optical routing element 520 can have static or active routing elements.

Additionally, the replaceable optical routing element 520 can contain passive or active integrated photonic elements. The replaceable optical routing element 520 can be printed with a desired configuration and it can be a wafer, a stack of wafers, or can contain compact optical elements. The replaceable routing element can be used as an optical router for parallel sensor heads, but can also include functionality such as a dedicated infrared sensor for some alignment marks or a different sensor such as a level sensor or an ellipsometer.

Figure 6B:
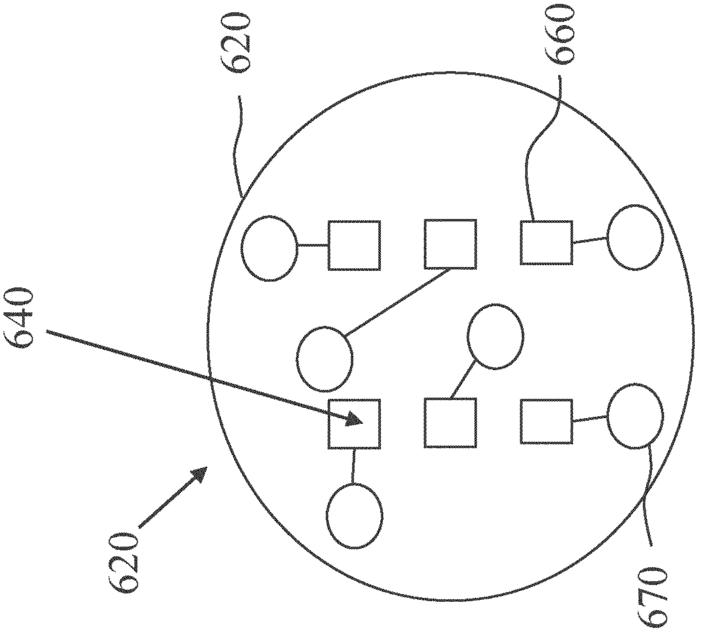
FIG. 6B depicts a top view of a metrology system, according to an embodiment.
Figure 6A:
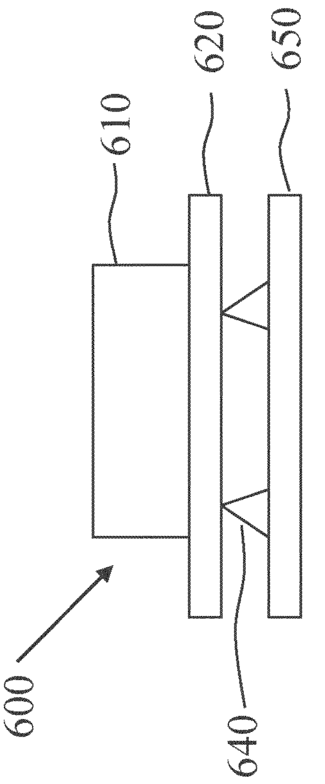
FIG. 6A depicts a side view of a metrology system, according to an embodiment.

FIG. 6A depicts a side view of a metrology system 600, according to some embodiments. The metrology system 600 comprises a sensor head 610, a replaceable routing element 620, a radiation beam 640, and a substrate (e.g., wafer) 650. The wafer 650 can be customizable based on the target alignment marks (not shown). In this embodiment, both the replaceable routing element 620 and sensor head 610 are fixed. The embodiment of FIG. 6A includes no moveable elements inside the sensor head 610, but employs the replaceable routing element 620, which can be swapped based on the desired configuration. The sensor head 610 may comprise integrated optics and/or glass optics and may convert light into an electrical signal from which the position information of the alignment mark may be extracted. The replaceable routing element 620 may comprise an integrated optical element or glass optics.

FIG. 6B depicts a top view of the replaceable routing element 620, according to some embodiments. The top view depicts the replaceable routing elements 620 including optical ports 660 that can receive the radiation beam 640 and that can be positioned at default positions, or otherwise predetermined/desired/implementation specific locations. These optical ports 660 correspond to the configuration of the sensor head 610. Sensor head 610 can be placed at many locations on the replaceable routing element 620. The replaceable routing element 620 can redirect light from the input optical ports 660 to the sensor head 610, and back again, to the optical output port 660. The replaceable routing element 620 can be swapped or exchanged so as to accommodate different alignment mark configurations for different optical routing layouts.

Additionally, the replaceable routing element 620 can be exchanged in various ways. For example, the replaceable routing element 620 can be changed automatically with a wafer handler (not pictured). This can be performed in parallel with a reticle swap. Alternatively, the replaceable routing element 620 can be exchange manually during a standard service operation of the machine.

Also, the optical routing, coupling, and sensing can be implemented as an integrated optical device. Integrated optical device refers to a monolithic device or IC, such as a single-chip particle inspection device having optical elements integrated on a single chip. In the integrated optical devices described herein, light can be guided by waveguides molded out of the chip. The waveguides can include Si, SiN (e.g., $Si_3N_4$), InP, AlN, $TiO_2$, $LiNbO_3$, any other suitable material, or any combination thereof, depending on the operational wavelength range of the integrated optical device. Typical wavelength range supported by SiN is from 0.3 μm to 5.5 μm, AlN supports a range from 0.2 μm to 13.6 μm, and Si a range of 1.1μ to 6.5 μm. While materials, such as the one mentioned above, in principle support a range of wavelengths, the definition of the waveguides, in particular their width and height, limits the operating wavelength range to a smaller wavelength range (e.g., a few nm). In some aspects, the integrated optical devices described herein can increase stability due to their small and monolithic design. Additionally, optical modules in the integrated optical devices described herein can be aligned by design (e.g., using lithography) to reduce or substantially eliminate device-to-device differences. In some aspects, the term "monolithic device" can refer to a single-chip device. For example, the term "monolithic inspection device" can refer to a single-chip integrated optical particle inspection device.

The replaceable routing element 620 can be disposed above the wafer 650 such that the sensor head 610 of the replaceable routing element 620 can be used in parallel to read the set of alignment marks on the wafer 650. Such parallelism between the replaceable routing element 620 and the wafer 650 can be achieved by the use of a scanner wafer stage or a set of actuators within the sensor head 610, or a combination of the two (not pictured). For example, the scanner wafer stage allows two wafers to move simultaneously. While one wafer is exposed, a position of the second wafer is measured by the metrology system 600.

In the embodiments of FIGS. 6A and 6B, the optical detection of the replaceable routing element 620 is included in the fixed part of the sensor head 610. The optical ports 660 include both input and output ports for light at fixed locations on the fixed part of the sensor head 610, to which the replaceable routing element 620 is connected to.

The optical ports 660 can be configured to transmit light coming from either a separate light source or a source integrated in the fixed part of the sensor head 610. Furthermore, the optical ports 660 can route, transmit, or otherwise direct light at the target alignment marks (not pictured) and direct reflected light back from the target alignment marks. The optical ports 660 transmit light to suitable light detectors, either within the sensor head 610 or external light detectors. For example, the external light detector may be a laser and can be connected to the sensor head 610 via an optical fiber.

The replaceable routing element 620 is configured to route light from the input optical ports 660, which are arranged in a fixed design, to the parallel optical sensors 670, which can be arranged in an implementation-specific manner as determined by a user, for example, based on metrology requirements. In FIG. 6B, only a few optical ports 660 and parallel optical sensors 670 are shown for illustrative purposes, but many more can be utilized. The parallel optical sensors 670 can be integrated or otherwise disposed on the replaceable routing element 620. The light coming from the parallel optical sensors 670 is then guided back to the output optical ports 660, which can also be in the same fixed configuration and from there light is transmitted or coupled to the integrated optical sensor head 610. The reading of the measurement takes place at the integrated optical sensor head 610.

The properties of the parallel optical sensors 670 can be changed, for example so as to have different sensitivity, different accuracy levels, or different detection mechanisms. Further, different functionality may include different measured observables, different detection wavelengths or wavelength bands, and/or different polarization. These types of change in properties can also be applied to the replaceable routing element 620.

The sensor head 610 and the routing on the replaceable routing element 620 are accomplished using integrated optics. The routing can be performed using waveguides, for example. Additionally, other variations having different geometrical arrangements can be applied to the replaceable routing element 620.

In some embodiments, the sensor head 610 may not be integrated with the replaceable routing element 620, but instead the sensor head 610 is fixed. The replaceable routing element 620 can provide a connection between the fixed optical ports 660 and sensor head 610 or between sensor head 610 and the alignment marks on the wafer 650.

The sensor head 610 can contain structural support, such as actuators (not pictured), if desired. The set of input and output optical ports 660 can be disposed at fixed locations, as illustrated in FIG. 6B.

Additionally, the parallel optical sensors 670, which are connected to the optical network, can provide the light sensing and detecting capabilities, as previously discussed. The parallel optical sensors 670 can be directly fixed, either mechanically or optically, to the replaceable routing element 620. There can also be an intermediate support (not pictured) structure to support the optical sensors.

Figure 7:
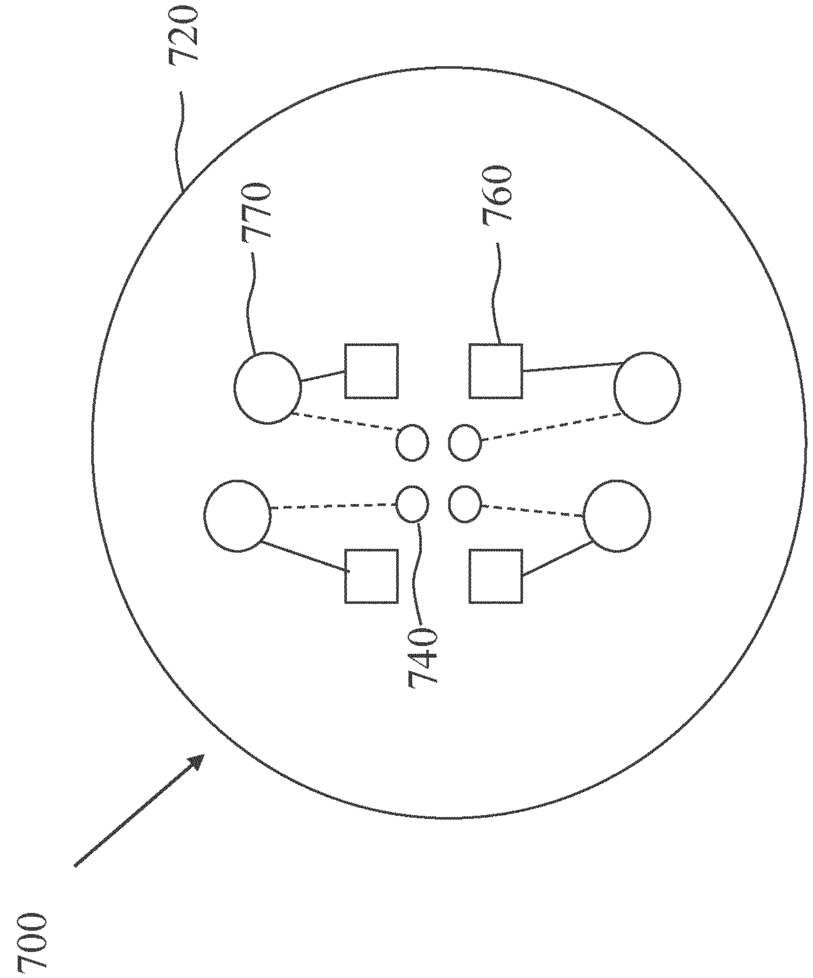
FIG. 7 depicts another view of a metrology system with both optical and electrical ports, according to an embodiment.

FIG. 7 depicts another view of a metrology system 700 with both optical 760 and electrical 740 ports. The embodiment of FIG. 7 is similar to the embodiment shown in FIG. 6. The replaceable routing element 720 contains customized parallel optical sensors 770, like those seen in FIG. 6, for detection of multiple targets in parallel (the wafer under inspection is not illustrated in FIG. 7).

However, active electric elements, such as light sources or light detectors, or other devices that transform optical signals in electronic signals and vice-versa, can be located on the replaceable routing element 720. This means the connection between the replaceable routing element 720 and the parallel optical sensor 770 is accomplished with at least electrical ports 740, such as electrical contacts. Any suitable electrical connection can be used, including connections for providing electrical power to the electrically "active" elements on the replaceable routing element 720.

The parallel optical sensors 770 can be integrated with photodetectors, for example. Optical ports 760 are for input light and the electrical ports 740 are for the output light. The parallel optical sensors 770 can be connected to the optical port input 760 and electrical port outputs 740 by either a waveguide (indicated by the solid line in FIG. 7) or an electrical connection (indicated by a dashed line in FIG. 7).

Figure 8:
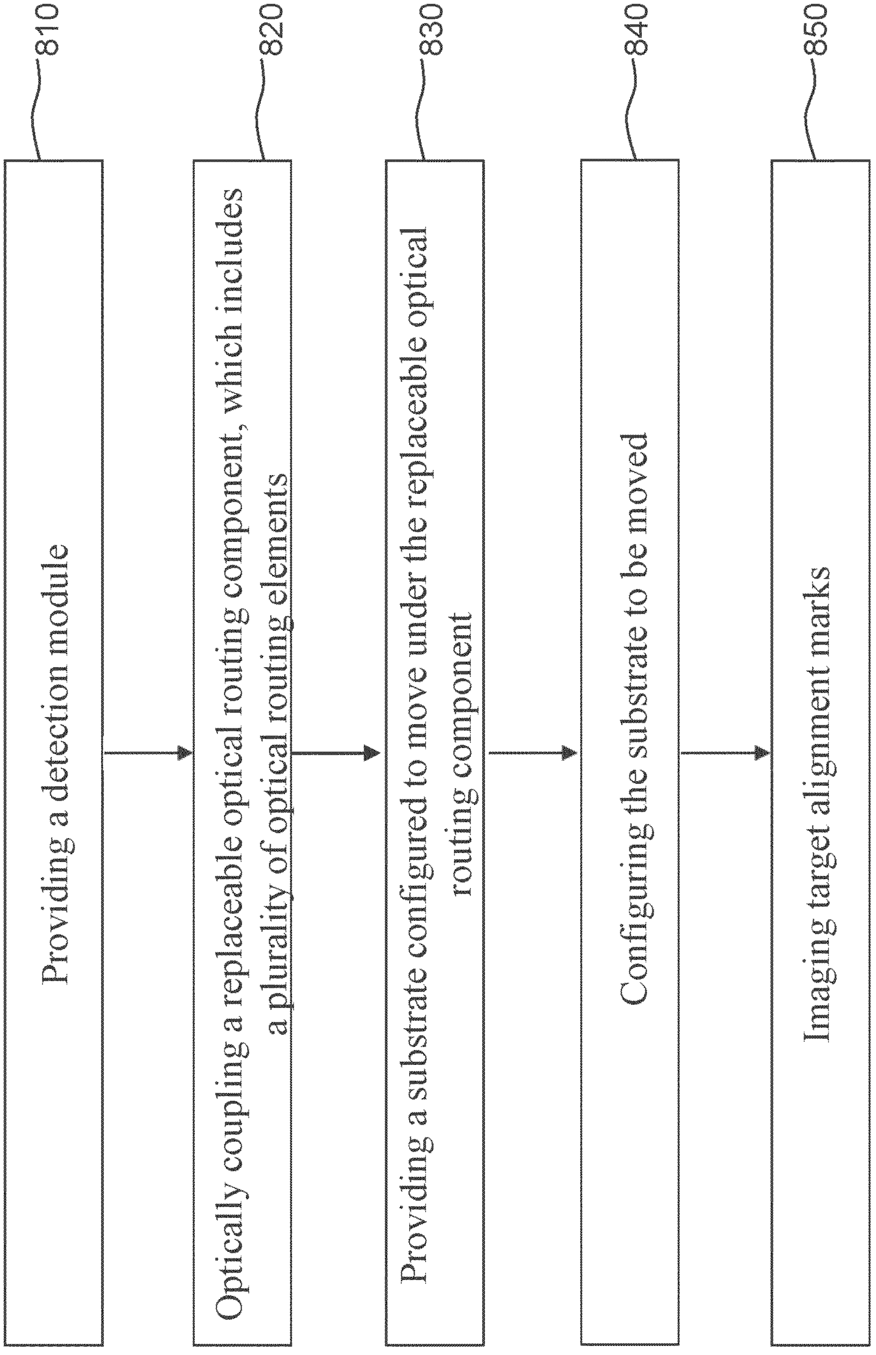
FIG. 8 describes a flowchart showing a method of a metrology system for imaging a plurality of target alignment marks of a substrate, according to an embodiment.

FIG. 8 describes a flowchart showing a method 800 of a metrology system for imaging a plurality of target alignment marks of a substrate.

In step 810, a detection module is provided.

In step 820, a replaceable optical routing component, such as a custom printed routing wafer that includes optical routing thereon for example, is optically coupled to the detection module. The replaceable optical routing component can include a plurality of optical routing elements, such as waveguides.

In step 830, a substrate with metrology target alignment marks to be inspected is positioned and configured to move under the replaceable optical routing component.

In step 840, the substrate can be configured to move.

In step 850, target alignment marks can be imaged.

The method 800 allows for measuring more target alignment marks at the same time, at a higher frequency. The replaceable optical routing component may be switched, or swapped out, for another component, based on the alignment marks that are being imaged on the substrate. Although the replaceable optical routing component may be swapped, the method steps cannot be rearranged. Furthermore, the substrate may be configured to move until all the target alignment marks on the substrate are measured.

The embodiments may further be described using the following clauses:

1. A metrology system for imaging a plurality of targets disposed on a substrate, the metrology system comprising:

a detection module; and a replaceable routing component, optically coupled to the detection module, and comprising a plurality of routing elements, and wherein the substrate is configured to be moved with respect to the replaceable routing component such that a first end of each of the plurality of routing elements is configured to overlay one of the plurality of targets and a second end of each of the plurality of routing elements is optically coupled to the detection module.

2. The metrology system of clause 1, wherein the substrate is further configured to be moved to a second position so as not to be positioned under the replaceable routing component.

3. The metrology system of clause 1, wherein the replaceable routing component includes waveguides or optical couplers.

4. The metrology system of clause 1, wherein the replaceable routing component is configured to permit the plurality of routing elements to be disposed thereon in a plurality of different locations.

5. The metrology system of clause 1, wherein the replaceable routing component is configured to guide light to or from the plurality of routing elements.

6. The metrology system of clause 1, wherein the system is configured such that the plurality of targets are imaged in parallel.

7. The metrology system of clause 1, wherein the plurality of routing elements are configured to detect light.
8. The metrology system of clause 1, wherein the replaceable routing component includes active or passive integrated photonic elements.
9. A metrology system for imaging a plurality of targets disposed on a substrate, the metrology system comprising:
a detection module; and
a replaceable routing component, optically coupled to the detection module, and comprising a plurality of routing elements,
wherein the replaceable routing component is configured to be positioned to overlay the substrate such that each of the plurality of routing elements overlays one of the plurality of targets.
10. The metrology system of clause 9, wherein the replaceable routing component includes waveguides or optical couplers.
11. The metrology system of clause 9, wherein the replaceable routing component is configured to permit the plurality of routing elements to be disposed thereon in a plurality of different locations.
12. The metrology system of clause 9, wherein the replaceable routing component is configured to guide light to or from the plurality of routing elements.
13. The metrology system of clause 9, wherein the metrology system is configured such that the plurality of targets are imaged in parallel.
14. The metrology system of clause 9, wherein the plurality of routing elements are configured to detect light.
15. The metrology system of clause 9, wherein the replaceable routing component includes active or passive integrated photonic elements.
16. A metrology system for imaging a plurality of targets disposed on a substrate, the metrology system comprising:
a replaceable routing component, comprising a plurality of routing elements and a plurality of sensors, wherein the replaceable routing component is configured to be moved to a first position so as to overlay the substrate such that a first end of each of the plurality of routing elements overlays one of the plurality of targets and a second end of each of the plurality of routing elements is optically coupled to one of the plurality of sensors, and
wherein the replaceable routing component is further configured to be moved to a second position so as not to overlay the substrate.
17. The metrology system of clause 16, wherein the replaceable routing component includes waveguides or optical couplers.
18. The metrology system of clause 16, wherein the replaceable routing component is configured to permit the plurality of routing elements to be disposed thereon in a plurality of different locations.
19. The metrology system of clause 16, wherein the replaceable routing component is configured to guide light to or from the plurality of routing elements.
20. The metrology system of clause 16, wherein the metrology system is configured such that the plurality of target alignment marks are imaged in parallel.
21. The metrology system of clause 16, wherein the replaceable routing component includes active or passive integrated photonic elements.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as specific examples of the more general terms "substrate" or "target portion", respectively. The substrate referred to herein can be processed, before or after exposure, in for example a track unit (a tool that typically applies a layer of resist to a substrate and develops the exposed resist) and/or a metrology unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam of radiation" or the like as used herein can encompass various types of electromagnetic radiation, for example, ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as matter beams, such as ion beams or electron beams. The terms "light," "illumination," or the like can refer to non-matter radiation (e.g., photons, UV, X-ray, or the like). Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:

1. A metrology system for imaging a plurality of targets disposed on a substrate, the metrology system comprising:
- one or more detectors; and
- a replaceable routing component, optically coupled to the one or more detectors, the replaceable routing component having a plurality of routing elements to each separately route radiation from a first surface of the replaceable routing component to a second surface of the replaceable routing component,
- wherein the substrate is configured to be moved with respect to the replaceable routing component such that a first end of each of the plurality of routing elements is configured to overlay one of the plurality of targets and a second end of each of the plurality of routing elements is optically coupled to the one or more detectors.

2. The metrology system of claim 1, wherein the substrate is further configured to be moved to a second position so as not to be positioned under the replaceable routing component.

3. The metrology system of claim 1, wherein the replaceable routing component includes waveguides or optical couplers.

4. The metrology system of claim 1, wherein the replaceable routing component is configured to permit the plurality of routing elements to be disposed thereon in a plurality of different locations.

5. The metrology system of claim 1, wherein the replaceable routing component is configured to guide light to or from the plurality of routing elements.

6. The metrology system of claim 1, wherein the system is configured such that the plurality of targets are imaged in parallel.

7. The metrology system of claim 1, wherein the replaceable routing component includes active or passive integrated photonic elements.

8. A metrology system for imaging a plurality of targets disposed on a substrate, the metrology system comprising:
- one or more detectors; and
- a replaceable routing component, optically coupled to the one or more detectors, the replaceable routing component having and comprising a plurality of routing elements to each separately route radiation from a first surface of the replaceable routing component to a second surface of the replaceable routing component,
- wherein the replaceable routing component is configured to be positioned to overlay the substrate such that each of the plurality of routing elements overlays one of the plurality of targets.

9. The metrology system of claim 8, wherein the replaceable routing component includes waveguides or optical couplers.

10. The metrology system of claim 8, wherein the replaceable routing component is configured to permit the plurality of routing elements to be disposed thereon in a plurality of different locations.

11. The metrology system of claim 8, wherein the replaceable routing component is configured to guide light to or from the plurality of routing elements.

12. The metrology system of claim 8, wherein the metrology system is configured such that the plurality of targets are imaged in parallel.

13. The metrology system of claim 8, wherein the plurality of routing elements are configured to detect light.

14. The metrology system of claim 8, wherein the replaceable routing component includes active or passive integrated photonic elements.

15. A replaceable routing component, comprising:
- a plurality of routing elements and a plurality of sensors,
- wherein each routing element is configured to separately route radiation from a first surface of the replaceable routing component to a second surface of the replaceable routing component,
- wherein the replaceable routing component is configured to be moved to a first position so as to overlay a substrate such that a first end of each of the plurality of routing elements overlays one of a plurality of targets on the substrate and a second end of each of the plurality of routing elements is optically coupled to one of the plurality of sensors, and
- wherein the replaceable routing component is further configured to be moved to a second position so as not to overlay the substrate.

16. The replaceable routing component of claim 15, wherein the replaceable routing component includes waveguides or optical couplers.

17. The replaceable routing component of claim 15, wherein the replaceable routing component is configured to permit the plurality of routing elements to be disposed thereon in a plurality of different locations.

18. The replaceable routing component of claim 15, wherein the replaceable routing component is configured to guide light to or from the plurality of routing elements.

19. The replaceable routing component of claim 15, wherein the system is configured such that the plurality of targets are imaged in parallel.

20. The replaceable routing component of claim 15, wherein the replaceable routing component includes active or passive integrated photonic elements.

* * * * *